(12) United States Patent
Shim et al.

(10) Patent No.: US 10,591,787 B2
(45) Date of Patent: *Mar. 17, 2020

(54) DISPLAY DEVICE HAVING AN AUXILIARY ELECTRODE

(71) Applicant: LG Display Co., Ltd., Seoul (KR)

(72) Inventors: Sung-Bin Shim, Yangsan-si (KR); Moon-Bae Gee, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 74 days.

This patent is subject to a terminal disclaimer.

(21) Appl. No.: 15/791,179

(22) Filed: Oct. 23, 2017

(65) Prior Publication Data

US 2018/0120620 A1 May 3, 2018

(30) Foreign Application Priority Data

Oct. 31, 2016 (KR) .......................... 10-2016-0143896

(51) Int. Cl.
*G02F 1/1343* (2006.01)
*H01L 51/52* (2006.01)
(Continued)

(52) U.S. Cl.
CPC .... *G02F 1/13439* (2013.01); *H01L 27/14636* (2013.01); *H01L 27/3246* (2013.01);
(Continued)

(58) Field of Classification Search
CPC ............. H01L 51/5228; H01L 27/3246; H01L 27/3258; H01L 27/326; H01L 27/3262; H01L 27/3279
See application file for complete search history.

(56) References Cited

U.S. PATENT DOCUMENTS 8,928,011 B2 * 1/2015 Tanada ................ H01L 27/3204
257/88
9,478,591 B2 10/2016 Nam et al.
(Continued)

FOREIGN PATENT DOCUMENTS

| CN | 104733500 A | 6/2015 |
| CN | 106057844 A | 10/2016 |

(Continued)

OTHER PUBLICATIONS

European Search Report for European Patent Application No. EP 17199361.1, dated Mar. 29, 2018, 9 Pages.
(Continued)

*Primary Examiner* — Tuan A Hoang
(74) *Attorney, Agent, or Firm* — Fenwick & West LLP

(57) ABSTRACT

A display device including an auxiliary electrode in order to prevent the luminance unevenness is provided. In the display device, an under-cut region may be formed by a first penetrating hole of a lower passivation layer and a second penetrating hole of an over-coat layer in order to connect an upper electrode to the auxiliary electrode. The second penetrating hole of the over-coat layer may be disposed to be offset from the first penetrating hole of the lower passivation layer, so that the under-cut region may be partially broken in an edge of the auxiliary electrode. Thus, the display device may improve the reliability of the electrical connection between the auxiliary electrode and the upper electrode.

19 Claims, 12 Drawing Sheets

(51) Int. Cl.
*H01L 27/32* (2006.01)
*H01L 27/146* (2006.01)

(52) U.S. Cl.
CPC ...... *H01L 27/3258* (2013.01); *H01L 27/3262* (2013.01); *H01L 27/3279* (2013.01); *H01L 51/5228* (2013.01); *H01L 27/3276* (2013.01)

(56) References Cited

U.S. PATENT DOCUMENTS

| | | | |
|---|---|---|---|
| 9,748,318 B2 | 8/2017 | Shim et al. | |
| 9,772,535 B2 | 9/2017 | Liu et al. | |
| 9,977,304 B2 | 5/2018 | Liu et al. | |
| 2014/0151653 A1* | 6/2014 | Kim | H01L 27/3258 257/40 |
| 2014/0346484 A1* | 11/2014 | Nendai | H01L 51/5228 257/40 |
| 2014/0374732 A1* | 12/2014 | Jeong | H01L 27/3246 257/40 |
| 2015/0179719 A1* | 6/2015 | Nam | H01L 27/3246 257/40 |
| 2016/0209690 A1* | 7/2016 | Liu | G02F 1/1368 |
| 2016/0293888 A1 | 10/2016 | Shim et al. | |
| 2017/0343846 A1 | 11/2017 | Liu et al. | |
| 2018/0239182 A1 | 8/2018 | Liu et al. | |

FOREIGN PATENT DOCUMENTS

| | | |
|---|---|---|
| EP | 2996151 | 3/2016 |
| EP | 3026724 | 6/2016 |
| TW | 201628169 A | 8/2016 |

OTHER PUBLICATIONS

China National Intellectual Property Administration, First Notification of Office Action, CN Patent Application No. 201711049385.0, dated Mar. 28, 2019, 12 pages.

* cited by examiner

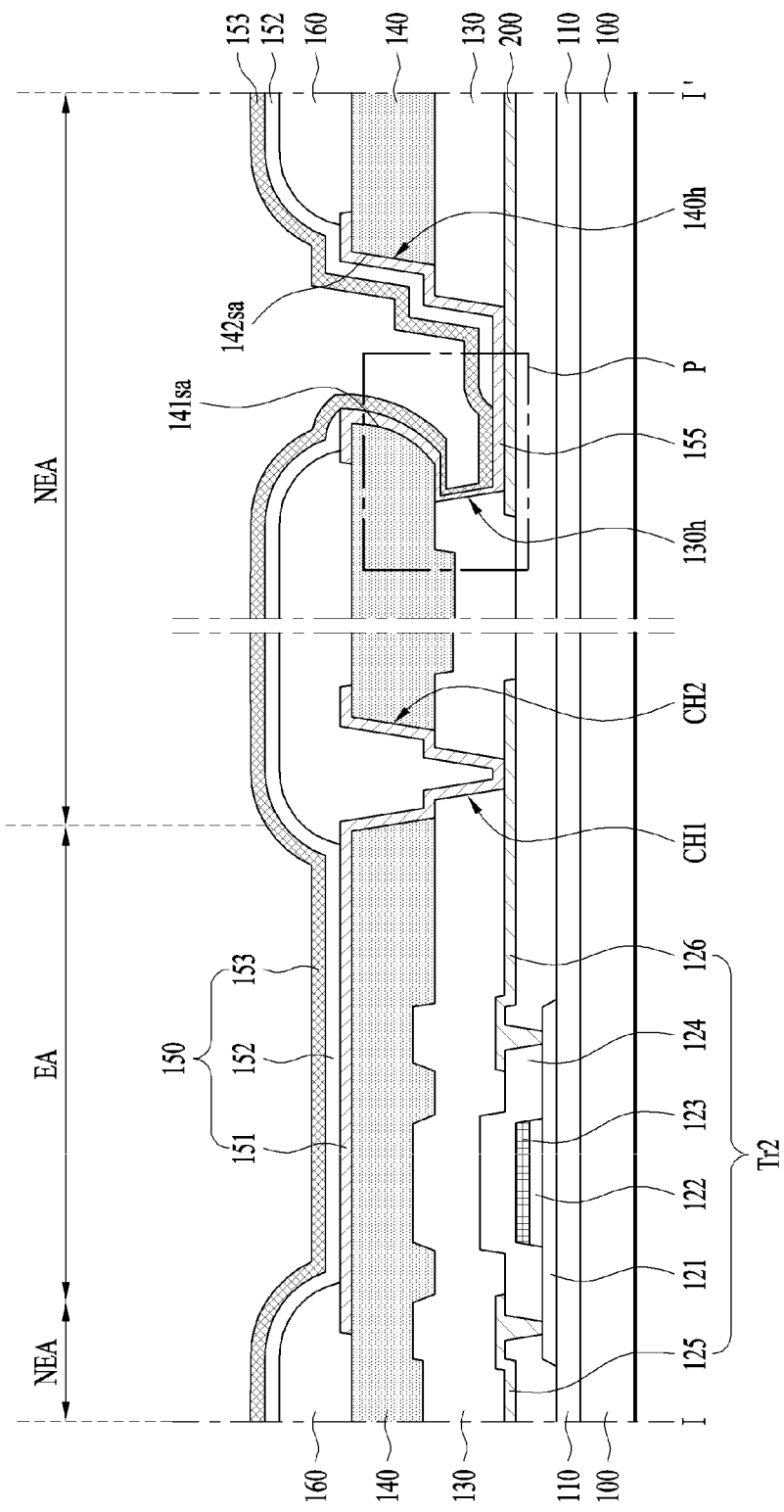

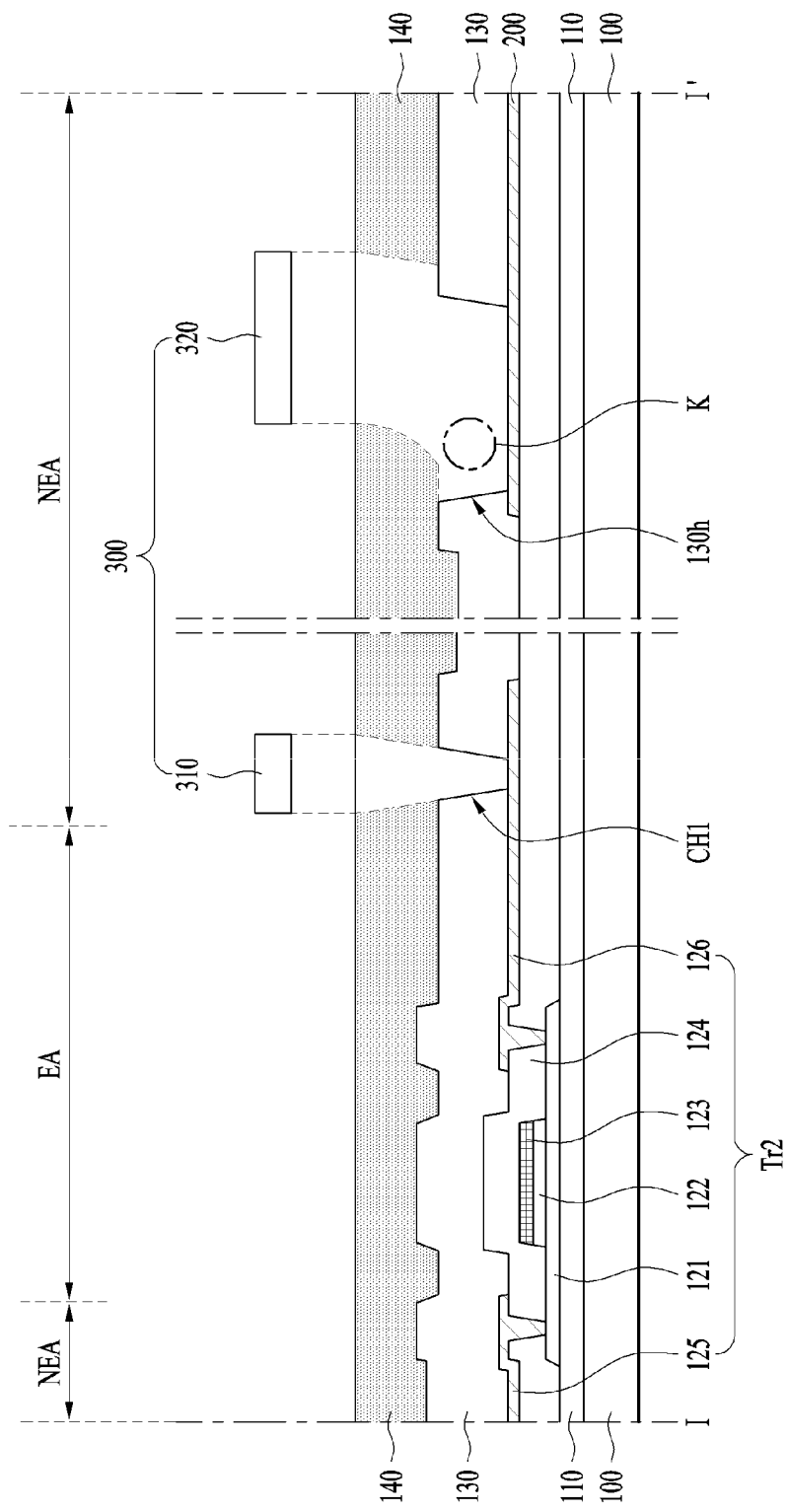

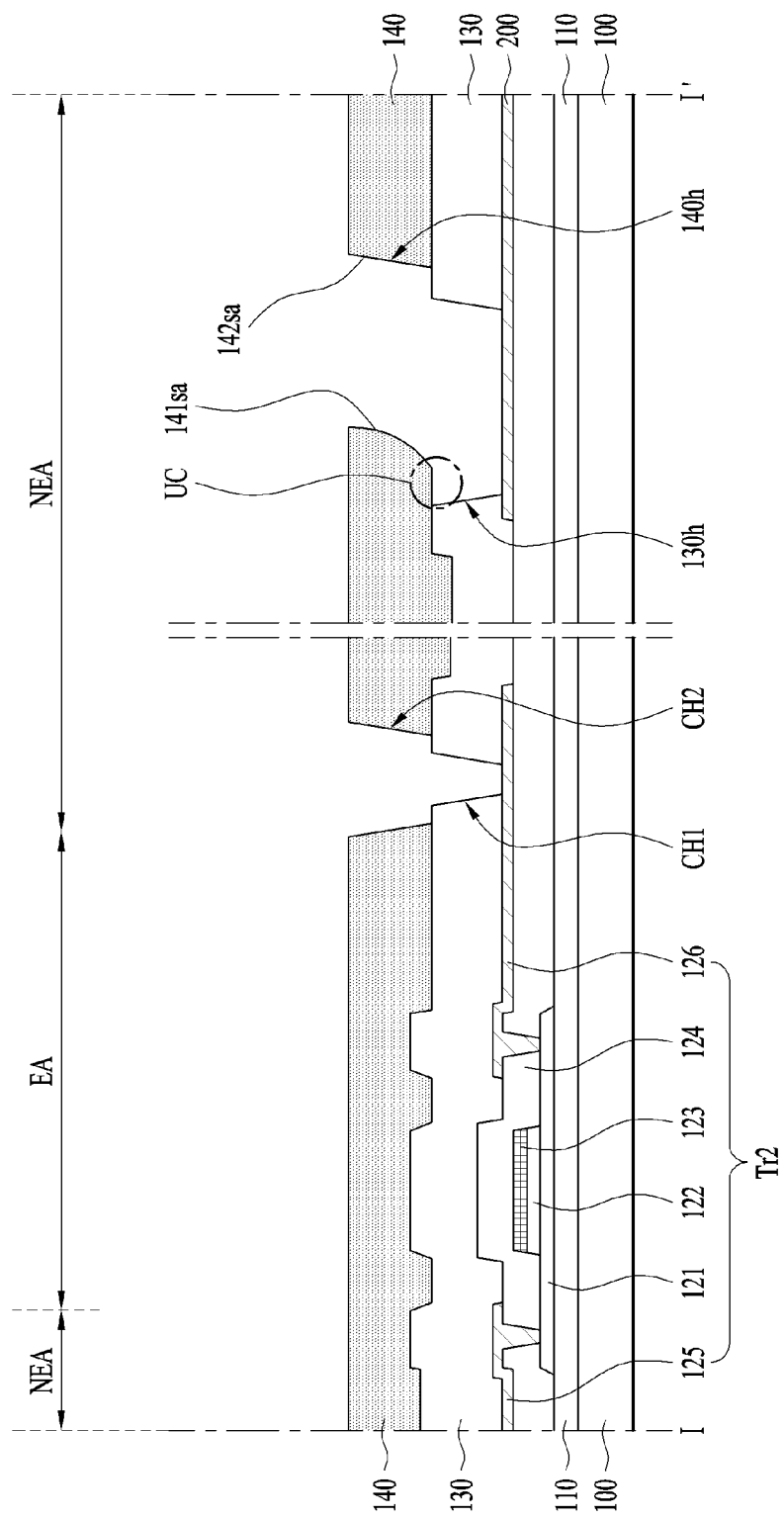

DISPLAY DEVICE HAVING AN AUXILIARY ELECTRODE

CROSS REFERENCE TO RELATED APPLICATION

This application claims the priority benefit of Korean Patent Application No. 10-2016-0143896, filed on Oct. 31, 2016, which is hereby incorporated by reference as if fully set forth herein.

BACKGROUND OF THE INVENTION

Field of the Invention

The present invention relates to a display device preventing the luminance unevenness by voltage drop using an auxiliary electrode.

Discussion of the Related Art

Generally, an electronic appliance, such as a monitor, a TV, a laptop computer, and a digital camera, include a display device to realize an image. For example, the display device may include a liquid crystal display device and an organic light-emitting display device.

The display device may include a light-emitting structure for realizing a specific color. For example, the light-emitting structure may include a lower electrode, a light-emitting layer and an upper electrode, which are sequentially stacked.

The display device may use an auxiliary electrode in order to prevent the voltage drop and the luminance unevenness due to a resistance of the upper electrode. The auxiliary electrode may be disposed on a non-light-emitting area of the display device disposed outside an emitting area of the display device. The light-emitting structure may be disposed on the emitting area of the display device. The auxiliary electrode may be electrically connected to the upper electrode of the light-emitting structure.

In the display device, various structures may be used to connect between the upper electrode and the auxiliary electrode. For example, the display device may prevent the light-emitting layer from being deposited on a portion of the auxiliary electrode using an under-cut region formed by a lower passivation layer and an over-coat layer disposed between the auxiliary electrode and the upper electrode. Thus, in the display device, the upper electrode formed by a process having better step coverage than the light-emitting layer may be electrically connected to the portion of the auxiliary electrode in which the light-emitting layer is not deposited.

However, the upper electrode may be formed to have a relatively thin thickness, or may be partially broken in the under-cut region formed by the lower passivation layer and the over-coat layer. Thus, in the display device, the electrical connection between the auxiliary electrode and the upper electrode by the under-cut region becomes unstable, and the luminance unevenness due to the resistance variation of the upper electrode may occur.

SUMMARY OF THE INVENTION

Accordingly, one or more embodiments of the present disclosure are directed to a display device having an auxiliary electrode that substantially obviates one or more problems due to limitations and disadvantages of the related art.

One object of the present disclosure is to provide a display device in which the electric connection between the auxiliary electrode and the upper electrode by the under-cut region may be stably performed.

Another object of the present disclosure is to provide a display device which may prevent the resistance variation of the upper electrode connected to the auxiliary electrode by the under-cut region.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

In one embodiment, there is provided a display device including an auxiliary electrode on a non-light-emitting area of a lower substrate. A lower passivation layer is disposed on the auxiliary electrode. The lower passivation layer includes a first penetrating hole exposing the auxiliary electrode. An over-coat layer is disposed on the lower passivation layer. The over-coat layer includes a second penetrating hole overlapping with the auxiliary electrode. The second penetrating hole includes a side surface intersecting, in a plan view of the display device, a side surface of the first penetrating hole.

The side surface of the second penetrating hole may include a first side region overlapping with the first penetrating hole and a second side region overlapping with the lower passivation layer. The first side region may have a reverse taper. The second side region may have a positive taper.

A plane shape of the second penetrating hole may be different from a plane shape of the first penetrating hole in a plan view of the display device.

The plan shape of the second penetrating hole may be a polygon of the same type as the plan shape of the first penetrating hole.

A length of the second penetrating hole may be larger than a length of the first penetrating hole in a first direction. A length of the second penetrating hole may be smaller than a length of the first penetrating hole in a second direction perpendicular to the first direction.

A planar size of the second penetrating hole may be smaller than a planar size of the first penetrating hole.

The location of the center of the second penetrating hole may be different from the location of the center of the first penetrating hole in a plan view of the display device.

The second penetrating hole may intersect side surfaces of the first penetrating hole which are facing each other.

In another embodiment, a display device includes a thin film transistor on a lower substrate. An auxiliary electrode spaced apart from the thin film transistor is disposed on the lower substrate. A lower passivation layer is disposed on the thin film transistor and the auxiliary electrode. A light-emitting structure including a lower electrode connected to the thin film transistor, an upper electrode connected to the auxiliary electrode, and a light-emitting layer between the lower electrode and the upper electrode is disposed on the lower passivation layer. An over-coat layer is disposed between the lower passivation layer and the light-emitting structure. The lower passivation and the over-coat layer include a contact hole in which the lower electrode is extended and a penetrating hole overlapping with the auxiliary electrode, respectively. Specifically, the lower passivation layer includes a first contact hole overlaps with the thin film transistor and a first penetrating hole overlaps with the auxiliary electrode. The over-coat layer includes a second contact hole overlapping with the first contact hole and a second penetrating hole overlapping the first penetrating hole. The penetrating hole of the over-coat layer includes a first side region that is negatively tapered and a second side region that is positively tapered.

The thin film transistor may include a gate electrode, a source electrode and a drain electrode. The auxiliary electrode may include a same material as one of the gate electrode, the source electrode and the drain electrode.

A connection electrode may be disposed between the auxiliary electrode and the upper electrode. The connection electrode may be extended onto the over-coat layer. The connection electrode may include a same material as the lower electrode.

The first side region of the second penetrating hole may be overlapping with the first penetrating hole. The second side region of the second penetrating hole may be planarly coincident with a side surface of the first penetrating hole.

A plane shape of the first penetrating hole may be a square shape. A plane shape of the second penetrating hole may be a circular shape inscribed to the first penetrating hole.

In another embodiment, a display device includes an auxiliary electrode on a lower substrate, a passivation layer on the auxiliary electrode, the passivation layer including a first penetrating hole exposing the auxiliary electrode, and an over-coat layer on the passivation layer, the over-coat layer including a second penetrating hole overlapping the first penetrating hole. The second penetrating hole includes a first side region that is negatively tapered and a second side region that is positively tapered.

The display device may include a light-emitting structure on the passivation layer which includes a lower electrode, an upper electrode, and a light-emitting layer between the lower electrode and the upper electrode. The upper electrode is electrically connected to the auxiliary electrode through the first penetrating hole and second penetrating hole.

The display device may include a connection electrode having a portion located in the first penetrating hole and on the auxiliary electrode. The upper electrode may have a portion located in the first penetrating hole and on the connection electrode.

A portion of the light-emitting layer may partially separate the connection electrode and the upper electrode in the first penetrating hole.

At least the portion of the connection electrode in the first penetrating hole and the portion of the upper electrode in the first penetrating hole may be in direct contact.

A portion of the over-coat layer may extend over a portion of first penetrating hole and meet the first side region of the second penetrating hole that is negatively tapered, the portion of the first penetrating hole corresponding to an undercut region. A portion of the upper electrode in the undercut region is thinner than a portion of the upper electrode in the second penetrating hole.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention.

FIG. 2A is a view taken along I-I' of FIG. 1A.

FIGS. 5A, 5B, 5C, 5D, 5E, and 5F are views sequentially showing a method of forming a display device according to an embodiment of the present invention.

DETAILED DESCRIPTION OF THE EMBODIMENTS

Figure 1A:
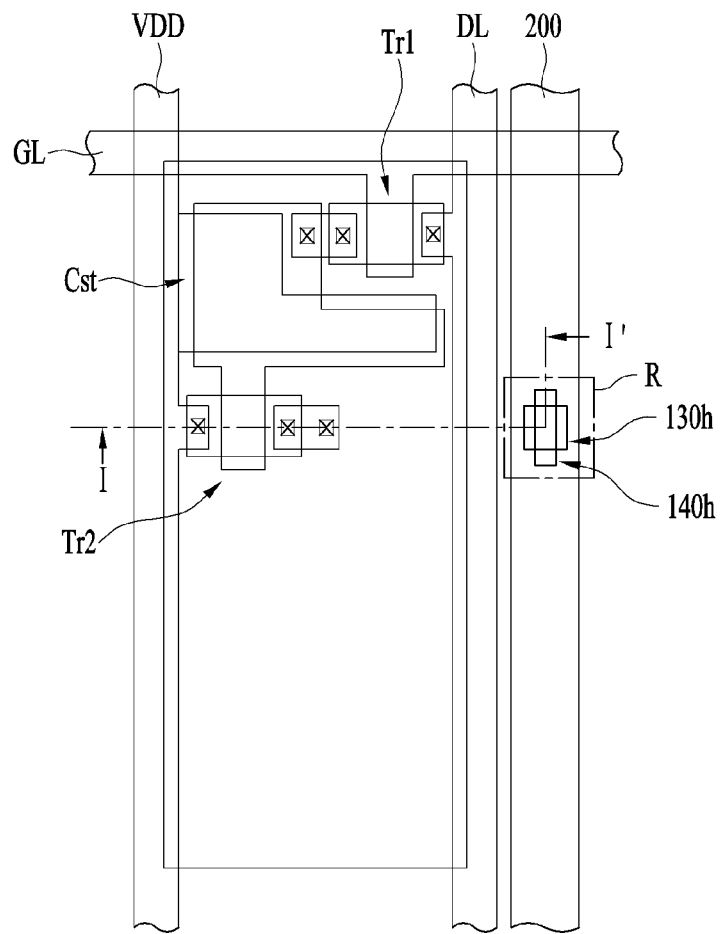
FIG. 1A is a plan view schematically showing a display device according to an embodiment of the present invention.

Hereinafter, details related to the above objects, technical configurations, and operational effects of the embodiments of the present invention will be clearly understood by the following detailed description with reference to the drawings, which illustrate some embodiments of the present invention. Here, the embodiments of the present invention are provided in order to allow the technical spirit of the present invention to be satisfactorily transferred to those skilled in the art, and thus the present invention may be embodied in other forms and is not limited to the embodiments described below.

In addition, the same or extremely similar elements may be designated by the same reference numerals throughout the specification, and in the drawings, the lengths and thickness of layers and regions may be exaggerated for convenience. It will be understood that, when a first element is referred to as being "on" a second element, although the first element may be disposed on the second element so as to come into contact with the second element, a third element may be interposed between the first element and the second element.

Here, terms such as, for example, "first" and "second" may be used to distinguish any one element with another element. However, the first element and the second element may be arbitrary named according to the convenience of those skilled in the art without departing the technical spirit of the present invention.

The terms used in the specification of the present invention are merely used in order to describe particular embodiments, and are not intended to limit the scope of the present invention. For example, an element described in the singular form is intended to include a plurality of elements unless the context clearly indicates otherwise. In addition, in the specification of the present invention, it will be further understood that the terms "comprises" and "includes" specify the presence of stated features, integers, steps, operations, elements, components, and/or combinations thereof, but do not preclude the presence or addition of one or more other features, integers, steps, operations, elements, components, and/or combinations.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Figure 1B:
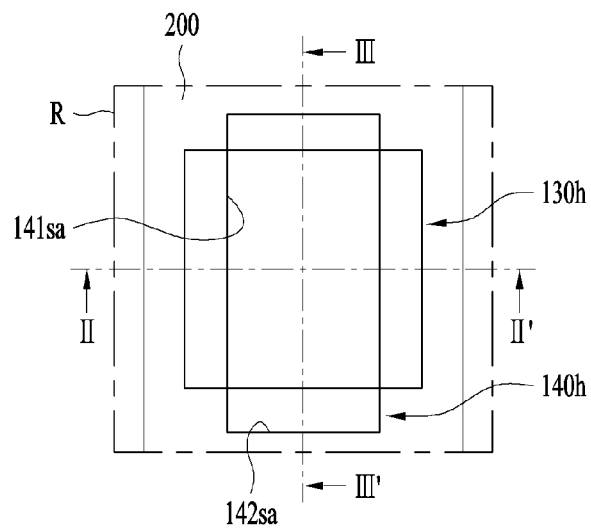
FIG. 1B is an enlarged view of region R in FIG. 1A.
Figure 2B:
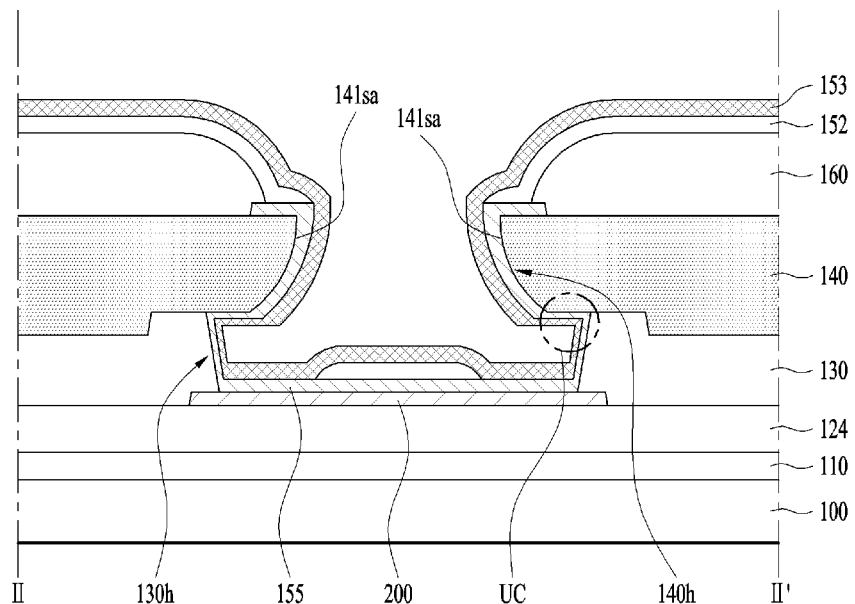
FIG. 2B is a view taken along II-II' of FIG. 1B.
Figure 2C:
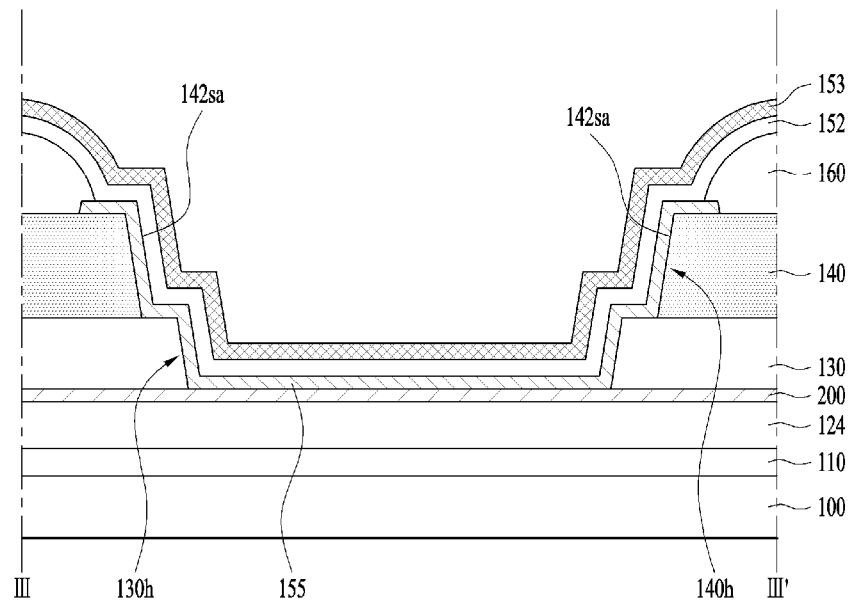
FIG. 2C is a view taken along III-III' of FIG. 1B.
Figure 3:
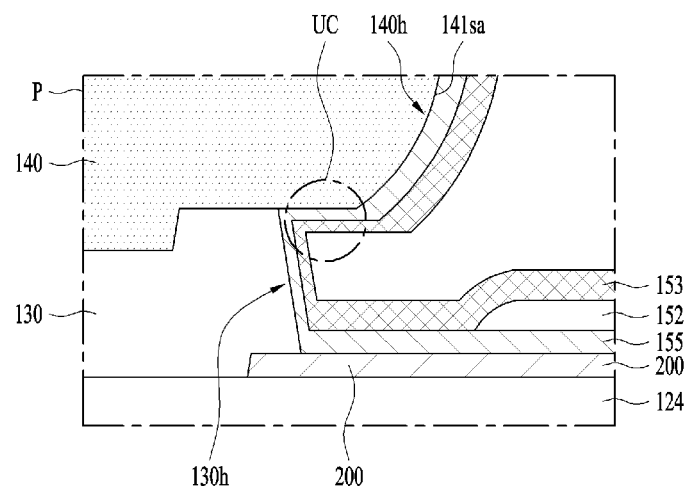
FIG. 3 is an enlarged view of region P in FIG. 2A.

FIG. 1A is a plane view schematically showing a display device according to an embodiment of the present invention. FIG. 1B is an enlarged view of region R in FIG. 1A. FIG. 2A is a view taken along I-I' of FIG. 1A. FIG. 2B is a view taken along II-II' of FIG. 1B. FIG. 2C is a view taken along III-III' of FIG. 1B. FIG. 3 is an enlarged view of region P in FIG. 2A.

Referring to FIGS. 1A, 1B, 2A to 2C and 3, the display device according to the embodiment of the present invention may comprise a lower substrate 100, thin film transistors Tr1 and Tr2, a lower passivation layer 130, an over-coat layer 140, a light-emitting structure 150 and an auxiliary electrode 200.

The lower substrate 100 may support the thin film transistors Tr1 and Tr2, the light-emitting structures 150 and the auxiliary electrode 200. The lower substrate 100 may include an insulating material. For example, the lower substrate 100 may include glass or plastic.

A gate line GL, a data line DL and a power supply line VDD may be disposed on the lower substrate 100. The data line DL may intersect the gate line GL. The power supply line VDD may be parallel with the gate line GL or the data line DL. For example, the power supply line VDD may intersect the gate line GL.

The gate line GL, the data line DL and the power supply line VDD may define pixel areas. For example, each pixel area may be surrounded by the gate line GL, the data line DL and the power supply line VDD. A circuit for controlling the light-emitting structure 150 may be disposed in each pixel area. For example, a selection thin film transistor Tr1, a driving thin film transistor Tr2 and a storage capacitor Cst may be disposed in each pixel area.

The selection thin film transistor Tr1 can turn on/off the driving thin film transistor Tr2 according to a gate signal applied through the gate line GL. The driving thin film transistor Tr2 can supply driving current to the corresponding light-emitting structure 150 according to a signal of the selection thin film transistor Tr1. For example, the selection thin film transistor Tr1 may have the same structure as the driving thin film transistor Tr2. The storage capacitor Cst can maintain the signal of the selection thin film transistor Tr1 applied to the driving thin film transistor Tr2 for a predetermined period.

The driving thin film transistor Tr2 may include a semiconductor pattern 121, a gate insulating layer 122, a gate electrode 123, an interlayer insulating layer 124, a source electrode 125 and a drain electrode 126.

The semiconductor pattern 121 may be disposed close to the lower substrate 100. The semiconductor pattern 121 may include a semiconductor material. For example, the semiconductor pattern 121 may include amorphous silicon or poly-silicon. For example, the semiconductor pattern 121 may include an oxide semiconductor material, such as IGZO.

The semiconductor pattern 121 may include a source region, a drain region and a channel region. The channel region may be disposed between the source region and the drain region. The conductivity of the channel region may be lower than the conductivity of the source region and the conductivity of the drain region. For example, the source region and the drain region may include a conductive impurity.

The display device according to the embodiment of the present invention may further comprise a buffer layer 110 between the lower substrate 100 and the semiconductor pattern 121. The buffer layer 110 may be extended to the outside of the thin film transistors Tr1 and Tr2. For example, the buffer layer 110 may cover the entire surface of the lower substrate 100. The buffer layer 110 may include an insulating material. For example, the buffer layer 110 may include silicon oxide.

The gate insulating layer 122 may be disposed on the semiconductor pattern 121. The gate insulating layer 122 may overlap the channel region of the semiconductor pattern 121. The gate insulating layer 122 may include an insulating material. For example, the gate insulating layer 122 may include silicon oxide and/or silicon nitride. The gate insulating layer 122 may include a high-K material. For example, the gate insulating layer 122 may include hafnium oxide (HfO) or titanium oxide (TiO). The gate insulating layer 122 may have a multi-layer structure.

The gate electrode 123 may be disposed on the gate insulating layer 122. The gate electrode 123 may overlap the channel region of the semiconductor pattern 121. For example, the gate insulating layer 122 may include a side surface continuous with a side surface of the gate electrode 123. The gate electrode 123 may include a conductive material. For example, the gate electrode 230 may include a metal, such as aluminum (Al), chrome (Cr), molybdenum (Mo) and tungsten (W).

The interlayer insulating layer 124 may be disposed on the semiconductor pattern 121 and the gate electrode 123. The interlayer insulating layer 124 may be extended beyond the semiconductor pattern 121. The gate insulating layer 122 and the gate electrode 123 may be completely surrounded by the interlayer insulating layer 124. For example, the interlayer insulating layer 124 may be in direct contact with the buffer layer 110 at the outside of the semiconductor pattern 121. The interlayer insulating layer 124 may include an insulating material. For example, the interlayer insulating layer 124 may include silicon oxide and/or silicon nitride. The interlayer insulating layer 124 may have a multi-layer structure.

The source electrode 125 and the drain electrode 126 may be disposed on the interlayer insulating layer 124. The drain electrode 126 may be spaced from the source electrode 125. The source electrode 125 may be electrically connected to the source region of the semiconductor pattern 121. The drain electrode 126 may be electrically connected to the drain region of the semiconductor pattern 121. For example, the interlayer insulating layer 124 may include contact holes exposing the source region and the drain region of the semiconductor pattern 121.

The source electrode 125 and the drain electrode 126 may include a conductive material. For example, the source electrode 125 and the drain electrode 126 may include metal, such as aluminum (Al), chrome (Cr), molybdenum (Mo) and tungsten (W). The drain electrode 126 may include the same material as the source electrode 125. For example, the drain electrode 126 may be formed by the same etching process as the source electrode 125. The gate electrode 123 may include a material different from the source electrode 125 and the drain electrode 126.

The display device according to the embodiment of the present invention is described that the semiconductor pattern 121 of each thin film transistor Tr1 and Tr2 is disposed close to the lower substrate 100. However, in a display device according to another embodiment of the present invention, the semiconductor pattern 121 of each thin film transistor Tr1 and Tr2 may be disposed between the gate electrode 123 and the source/drain electrodes 125 and 126.

The auxiliary electrode 200 may be disposed on the lower substrate 100. The auxiliary electrode may prevent a luminance unevenness due to a voltage drop of the upper electrode. The auxiliary electrode may carry a fixed voltage potential, such as a ground voltage potential or a negative voltage potential. The auxiliary electrode 200 may be spaced apart from the thin film transistors Tr1 and Tr2. The auxiliary electrode 200 may be parallel with the gate line GL and/or the data line DL. For example, the auxiliary electrode 200 may be parallel with the data line DL. The auxiliary electrode 200 may be disposed in the outside of the data line DL.

The auxiliary electrode 200 may include a same material as one of conductive materials constituting the thin film transistors Tr1 and Tr2. For example, the auxiliary electrode 200 may be formed using a process of forming the thin film transistors Tr1 and Tr2. The auxiliary electrode 200 may include a same material as one of the gate electrode 123, the source electrode 125 and the drain electrode 126 of the thin film transistors Tr1 and Tr2. For example, the auxiliary electrode 200 may include a same material as the source electrode 125 and the drain electrode 126 of the thin film transistors Tr1 and Tr2. The auxiliary electrode 200 may be disposed on the interlayer insulating layer 124.

The lower passivation layer 130 may be disposed on the thin film transistors Tr1 and Tr2 and the auxiliary electrode 200. The lower passivation layer 130 may include an insulating material. For example, the lower passivation layer 130 may include silicon oxide and/or silicon nitride. The lower passivation layer 130 may have a multi-layer structure.

The lower passivation layer 130 may include a first contact hole CH1 and a first penetrating hole 130h.

The first contact hole CH1 of the lower passivation layer 130 may overlap the driving thin film transistor Tr2. For example, the first contact hole CH1 of the lower passivation layer 130 may expose the drain electrode 126 of the driving thin film transistor Tr2.

The first penetrating hole 130h of the lower passivation layer 130 may overlap the auxiliary electrode 200. The auxiliary electrode 200 may be exposed by the first penetrating hole 130h of the lower passivation layer 130. The lower passivation layer 130 may cover only an edge of the auxiliary electrode 200.

The over-coat layer 140 may be disposed on the lower passivation layer 130. The over-coat layer 140 may remove a thickness difference caused by the thin film transistors Tr1 and Tr2. The over-coat layer 140 may include an organic insulating material. For example, the over-coat layer 140 may include a thermosetting resin.

The over-coat layer 140 may include a second contact hole CH2 and a second penetrating hole 140h.

The second contact hole CH2 of the over-coat layer 140 may be aligned with the first contact hole CH1 of the lower passivation layer 130. A size of the second contact hole CH2 may be larger than a size of the first contact hole CH1. For example, side surfaces of the first contact hole CH1 may be disposed inside the second contact hole CH2. The second contact hole CH2 may expose the entire portion of the drain electrode 126 of the driving thin film transistor Tr2 exposed by the first contact hole CH1.

The second penetrating hole 140h of the over-coat layer 140 may overlap the auxiliary electrode 200. The second penetrating hole 140h of the over-coat layer 140 may be aligned with the first penetrating hole 130h of the lower passivation layer 130.

The second penetrating hole 140h may include a side surface intersecting a side surface of the first penetrating hole 130h. The side surface of the second penetrating hole 140h may cross at least one side surface of the first penetrating hole 130h. For example, the second penetrating hole 140h may include a first side region 141sa disposed inside the first penetrating hole 130h and a second side region 142sa disposed outside the first penetrating hole. The second side region 142sa may overlap the lower passivation layer 130. The first side region 141sa of the second penetrating hole 140h may have a reverse taper (which may also be referred to as negative taper). The second side region 142sa of the second penetrating hole 140h may have a positive taper.

An end portion of the over-coat layer 140 including the first side region 141sa may extend from the lower passivation layer 130 inward to the first penetrating hole 130h. The lower passivation layer 130 may be not disposed between the auxiliary electrode 200 and the end portion of the over-coat layer 140 including the first side region 141sa. An under-cut region UC formed by the lower passivation layer 130 and the over-coat layer 140 may be disposed on the auxiliary electrode 200. The under-cut region UC may overlap the end portion of the over-coat layer 140 including the first side region 141sa. A portion of the over-coat layer 140 extends over a portion of the first penetrating hole 130h to meet the first side region 141sa of the second penetrating hole 140h that is negatively tapered. The portion of the first penetrating hole 130h may be referred to as an under-cut region UC.

The second side region 142sa of the second penetrating hole 140h may be connected to the first side region 141sa of the second penetrating hole 140h. For example, the side surface of the second penetrating hole 140h intersecting the first penetrating hole 130h may have a structure in which the first side region 141sa having a reverse taper is disposed between the second side regions 142sa having positive taper. The under-cut region UC may be not disposed between the end portion of the over-coat layer 140 including the first side region 141sa and the auxiliary electrode 200. The under-cut region UC may be not extended along the second penetrating hole 140h of the over-coat layer 140.

A plane shape of the second penetrating hole 140h may be different from a plane shape of the first penetrating hole 130h. For example, a length of the second penetrating hole 140h may be larger than a length of the first penetrating hole 130h in a first direction, and a length of the second penetrating hole 130h may be smaller than a length of the first penetrating hole 130h in a second direction perpendicular to the first direction. The second penetrating hole 140h may be a polygon of the same type as the first penetrating hole 130h. For example, the plane shape of the first penetrating hole 130h may be a square shape, and the plane shape of the second penetrating hole 140h may be a rectangular shape which intersects the first penetrating hole 130h and extends in a direction in which the auxiliary electrode extends. A planar size of the second penetrating hole 140h may be smaller than a planar size of the first penetrating hole 130h.

The light-emitting structure 150 may realize a specific color. For example, the light-emitting structure 150 may include a lower electrode 151, a light-emitting layer 152 and an upper electrode 153, which are sequentially stacked.

The light-emitting structure 150 may be controlled by the thin film transistors Tr1 and Tr2. For example, the lower electrode 151 of the light-emitting structure 150 may be electrically connected to the drain electrode 126 of the driving thin film transistor Tr2. The light-emitting structure 150 may be disposed on the over-coat layer 140. For example, the lower electrode 151 may be extended along a side surface of the first contact hole CH1 of the lower passivation layer 130 and a side surface of the second contact hole CH2 of the over-coat layer 140.

The lower electrode 151 may include a conductive material. The lower electrode 151 may include a material having high reflectivity. For example, the lower electrode 151 may include a metal, such as aluminum (Al) and argentum (Ag). The lower electrode 151 may have a multi-layer structure.

For example, the lower electrode 151 may include a structure in which a reflection electrode including a material having high reflectivity is disposed between transparent electrodes including a transparent conductive material such as ITO and IZO.

The light-emitting layer 152 may generate light having luminance corresponding to a voltage difference between the lower light-emitting electrode 151 and the upper light-emitting electrode 153. For example, the light-emitting layer 152 may include an emitting material layer (EML) having an emission material. The emission material may include an organic material, an inorganic material or a hybrid material. For example, the display device according to the embodiment of the present invention may be an organic light-emitting display device having an organic light-emitting layer.

The light-emitting layer 152 may have a multi-layer structure in order to increase luminous efficacy. For example, the light-emitting layer 152 may further include a hole injection layer (HIL), a hole transporting layer (HTL), an electron transporting layer (ETL), and an electron injection layer (EIL).

The upper electrode 153 may include a conductive material. The upper electrode 153 may include a material different from the lower electrode 151. For example, the upper electrode 153 may include only a transparent material. Thus, in the display device according to the embodiment of the present invention, the light generated by the light-emitting layer 152 may be emitted to the outside through the upper electrode 153.

The display device according to the embodiment of the present invention may further comprise a bank insulating layer 160 in order to insulate between the adjacent lower electrodes 151 of the adjacent pixel areas. For example, the bank insulating layer 160 may cover an edge of the lower electrode 151. The light-emitting layer 152 and the upper electrode 153 may be stacked on a surface of the lower electrode 151 exposed by the bank insulating layer 160. Thus, in the display device according to the embodiment of the present invention, the lower substrate 100 may include a light emitting area EA and a non-light-emitting area NEA disposed outside the light emitting area EA. The light-emitting structure 150 including the lower electrode 151, the light-emitting layer 152 and the upper electrode 153 which are sequentially stacked may be disposed on the light emitting area EA of the lower substrate 100. The auxiliary electrode 200 may be disposed on the non-light-emitting area NEA of the lower substrate 100.

The light-emitting layer 152 and the upper electrode 153 may be extended onto the bank insulating layer 160. The light-emitting layer 152 and the upper electrode 153 may extend onto the non-light-emitting area NEA of the lower substrate 100. The light-emitting layer 152 and the upper electrode 153 may be extended onto the auxiliary electrode 200.

The light-emitting layer 152 may be partially broken due to the first side region 141sa of the second penetrating hole 140h of the over-coat layer 140. The light-emitting layer 152 may be not disposed on the under-cut region UC. A surface of the auxiliary electrode 200 overlapping with the end portion of the over-coat layer 140 including the first side region 141sa may be not covered by the light-emitting layer 152. The auxiliary electrode 200 in the under-cut region UC may be exposed by the light-emitting layer 152.

The upper electrode 153 may be extended along the light-emitting layer 152. The upper electrode 153 may have better step coverage than the light-emitting layer 152. For example, the upper electrode 153 may extend onto the first side region 141sa of the second penetrating hole 140h. The upper electrode 153 may cover the end portion of the over-coat layer 140 including the first side region 141sa, a side surface of the lower passivation layer 130 disposed close to the first side region 141sa of the over-coat layer 140, and a surface of the auxiliary electrode 200 overlapping with the first side region 141sa of the over-coat layer 140. A portion of the upper electrode 153 in the under-cut region UC may be thinner than a portion of the upper electrode 153 in the second penetrating hole 140h (e.g., portion of upper electrode on first side region 141sa or the second side region 142sa). The surface of the auxiliary electrode 200 exposed by the light-emitting layer 152 may be covered by the upper electrode 153. The auxiliary electrode 200 may be electrically connected to the upper electrode 153 by the under-cut region UC.

On the second side region 142sa of the second penetrating hole 140h of the over-coat layer 140, the light-emitting layer 152 and the upper electrode 153 may be extended onto the auxiliary electrode 200 without the thickness variation. The upper electrode 153 on the second side region 142sa of the over-coat layer 140 may be connected to the upper electrode 153 on the first side region 141sa of the over-coat layer 140. The upper electrode 153 covering the surface of the auxiliary electrode 200 in the under-cut region UC may be connected to the upper electrode 153 on the second side region 142sa of the over-coat layer 140. Thus, even if the thickness of the upper electrode 153 is thinned or the upper electrode 153 is partially broken in the under-cut region UC, in the display device according to the embodiment of the present invention, increasing the resistance of the upper electrode 153 may be prevented by the upper electrode 153 extending to the second side region 142sa of the second penetrating hole 140h. Therefore in the display device according to the embodiment of the present invention, the resistance variation of the upper electrode 153 connected to the auxiliary electrode 200 due to the under-cut region UC may be prevented.

The display device according to the embodiment of the present invention may further comprise a connection electrode 155 between the upper electrode 153 and the auxiliary electrode 200. The connection electrode 155 may include a conductive material. The connection electrode 155 may include a same material as a conductive structure formed between the step of forming the over-coat layer 140 and the step of forming the upper electrode 153. For example, the connection electrode 155 may include a same material as the lower electrode 151.

The connection electrode 155 may have better step coverage than the light-emitting layer 152. The connection electrode 155 may be extended along the side surface of the first penetrating hole 130h of the lower passivation layer 130 and the side surface of the second penetrating hole 140h of the over-coat layer 140. The connection electrode 155 may be extended onto the first side region 141sa of the second penetrating hole 140h. The light-emitting layer 152 may not cover a surface of the connection electrode 155 in the under-cut region UC. The upper electrode 153 may be electrically connected to the connection electrode 155 overlapping with the under-cut region UC. Thus, in the display device according to the embodiment of the present invention, the electrical connection between the auxiliary electrode 200 and the upper electrode 153 by the under-cut region UC may be effectively maintained by the connection electrode 155.

Accordingly, in the display device according to the embodiment of the present invention, since the second penetrating hole 140h of the over-coat layer 140 above the first penetrating hole 130h of the lower passivation layer 130 exposing the auxiliary electrode 200 includes the first side region 141sa which is negatively tapered and the second side region 142sa which is positively tapered, the under-cut region UC for forming a portion of the auxiliary electrode 200 which is not covered by the light-emitting layer 152 may be not continuous due to the second side region 142sa of the over-coat layer 140, so that the resistance variation of the upper electrode 153 caused by the under-cut region UC may be prevented.

Figure 4A:
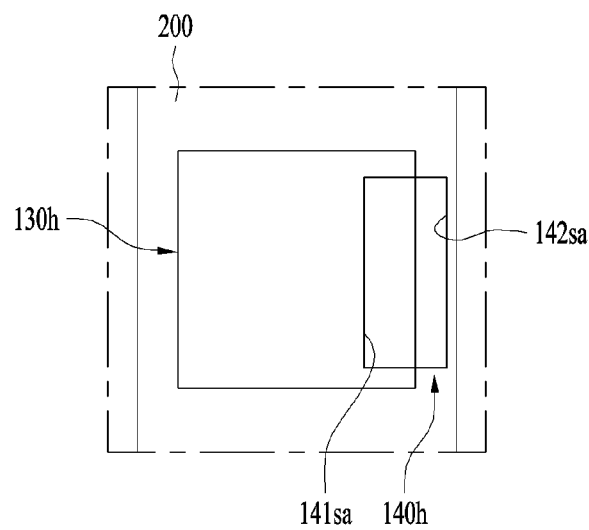
FIGS. 4A, 4B, 4C, 4D, and 4E are plan views respectively showing a first penetrating hole of a lower passivation layer and a second penetrating hole of an over-coat layer of a display device according to another embodiment of the present invention.

The display device according to the embodiment of the present invention is described that the second penetrating hole 140h of the over-coat layer 140 completely traverses the first penetrating hole 130h of the lower passivation layer 130 having a square planar shape. However, in the display device according to another embodiment of the present invention, the second penetrating hole 140h may partially expose a side surface of the first penetrating hole 130h, as shown in FIG. 4A. In the display device according to another embodiment of the present invention, the planar size of the second penetrating hole 140h may be smaller than the planar size of the first penetrating hole 130h. In the display device according to another embodiment of the present invention, a side surface of the second penetrating hole 140h extending in a first direction and a side surface of the second penetrating hole 140h extending in a second direction perpendicular to the first direction may be shorter than the corresponding side surface of the first penetrating hole 130h.

Figure 4B:
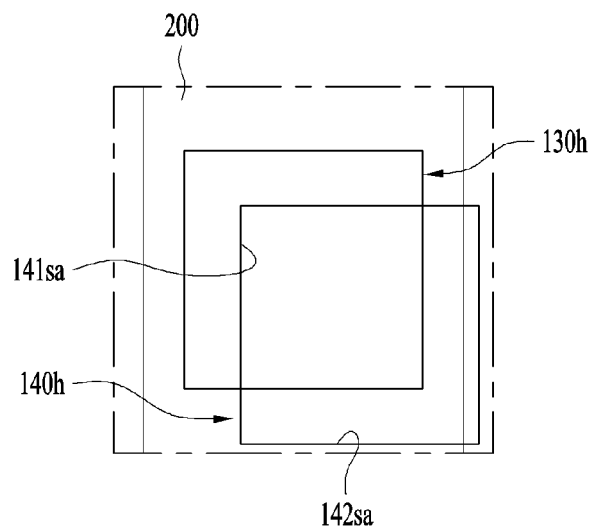

The display device according to the embodiment of the present invention is described that the second penetrating hole 140h has a plane shape different from the first penetrating hole 130h. However, in the display device according to another embodiment of the present invention, the plane shape of the second penetrating hole 140h is same as the plane shape of the first penetrating hole 130h. For example, in the display device according to another embodiment of the present invention, the second penetrating hole 140h may have a same plane shape as the first penetrating hole 130h, and the location of the center of the second penetrating hole 140h may be different from the location of the center of the first penetrating hole 130h, as shown in FIG. 4B.

Figure 4C:
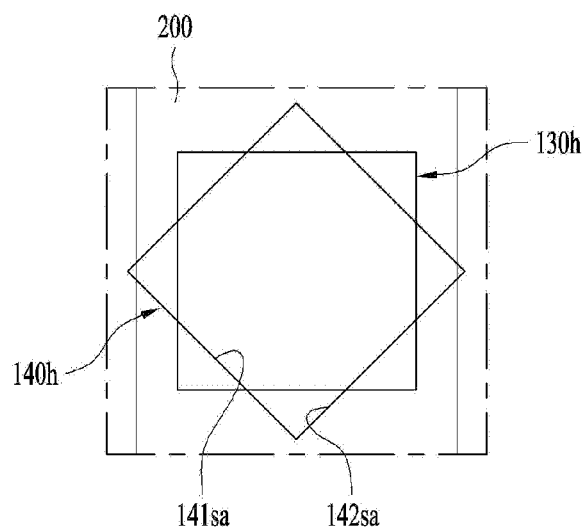
Figure 4D:
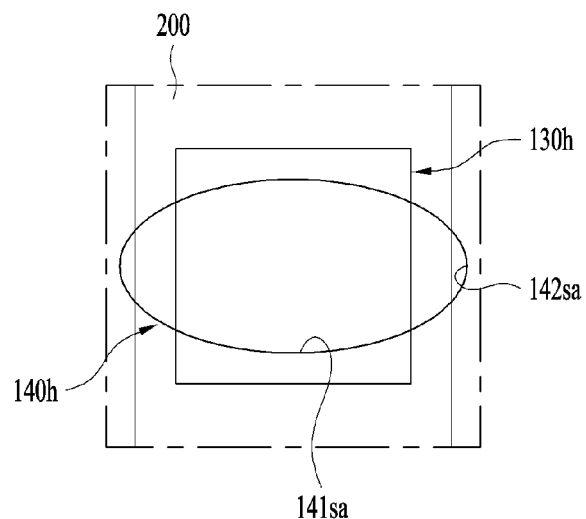

The display device according to the embodiment of the present invention is described that the second penetrating hole 140h has a planar size smaller than the first penetrating hole 130h. However, in the display device according to another embodiment of the present invention, the second penetrating hole 140h may have the same or larger planar size as the first penetrating hole 130h. For example, in the display device according to another embodiment of the present invention, the plane shape of the second penetrating hole 140h may be same as the plane shape of the first penetrating hole 130h planarly rotated of 0° to 90°, as shown in FIG. 4C.

The display device according to the embodiment of the present invention is described that the plane shape of the second penetrating hole 140h is a polygonal of the same type as the first penetrating hole 130h. However, in the display device according to another embodiment of the present invention, the plane shape of the second penetrating hole 140h may be a polygonal shape different from the plane shape of the first penetrating hole. For example, in the display device according to another embodiment of the present invention, the plane shape of the first penetrating hole 130h may be a square shape, and the plane shape of the second penetrating hole 140h may be a circle shape.

Figure 4E:
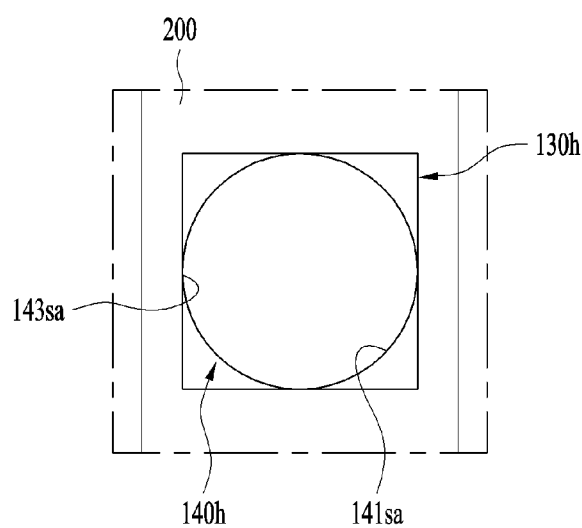

The display device according to the embodiment of the present invention is described that a portion of the second penetrating hole 140h overlaps with the lower passivation layer 130. However, if the side surface of the second penetrating hole 140h may include a region having a reverse taper and a region having positive taper, the display device according to another embodiment of the present invention may be independent of any positional relationship between the second penetrating hole 140h and the first penetrating hole 130h. For example, in the display device according to another embodiment of the present invention, the plane shape of the first penetrating hole may be a square shape and the plane shape of the second penetrating hole may be a circular shape inscribed to the first penetrating hole, as shown in FIG. 4E. In the display device according to another embodiment of the present invention, the second penetrating hole 140h may include the first side region 141sa disposed inside the first penetrating hole 130h and the second side region 143sa planarly coincident with the side surface of the first penetrating hole 130h. In the display device according to another embodiment of the present invention, the first side region 141sa of the second penetrating hole 140h may be negatively tapered and the second side region 143sa of the second penetrating hole 140h may be positively tapered.

FIGS. 5A to 5F are views sequentially showing a method of forming a display device according to an embodiment of the present invention.

Figure 5A:
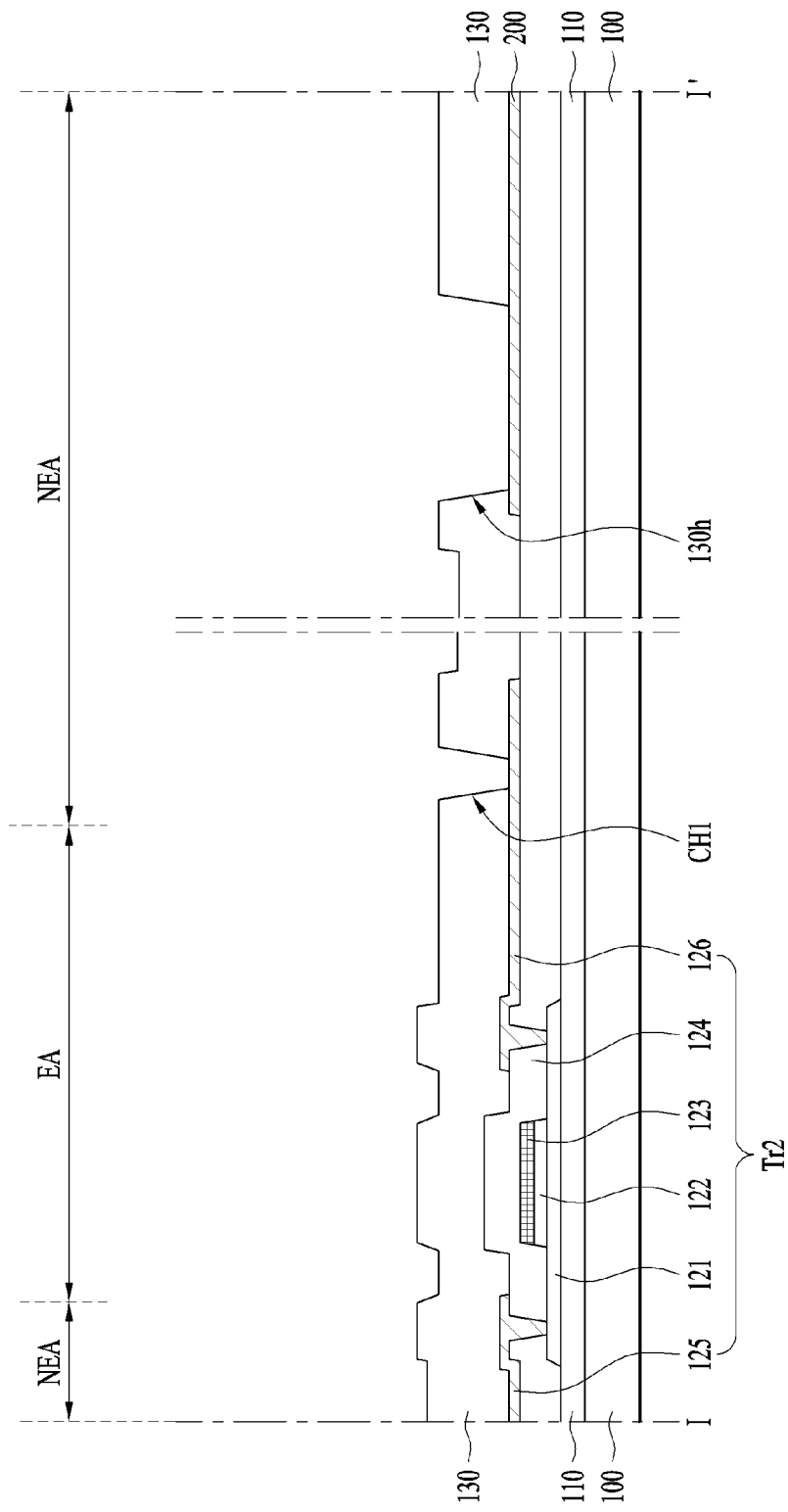

A method of forming the display device according to an embodiment of the present invention will be described with reference to FIGS. 2A and 5A to 5F. First, as shown in FIG. 5A, the method of forming the display device according to the embodiment of the present invention may comprise a step of forming a buffer layer 110 on a lower substrate 100 including a light emitting area EA and a non-light-emitting area NEA, a step of forming a thin film transistor Tr2 on the buffer layer 110, a step of forming an auxiliary electrode 200 spaced apart from the thin film transistor Tr2 on the buffer layer 110, a step of forming a lower passivation layer 130 on the thin film transistor Tr2 and the auxiliary electrode 200, and a step of forming a first contact hole CH1 and a first penetrating hole 130h in the lower passivation layer 130.

The step of forming the thin film transistor Tr2 may include a step of forming a semiconductor pattern 121, a step of forming a gate insulating layer 122 on the semiconductor pattern 121, a step of forming a gate electrode 123 on the gate insulating layer 122, a step of forming an interlayer insulating layer 124 covering the gate electrode 123, and a step of forming a source electrode 125 and a drain electrode 126 on the interlayer insulating layer 124.

The auxiliary electrode 200 may be formed on the non-light-emitting area NEA of the lower substrate 100. The auxiliary electrode 200 may be formed by a process of forming a structure including a conductive material in a step of forming the thin film transistor Tr2. For example, the auxiliary electrode 200 may be formed by a step of forming the source electrode 125 and the drain electrode 126 of the thin film transistor Tr2. The auxiliary electrode 200 may be formed simultaneously with the source electrode 125 and the drain electrode 126. The auxiliary electrode 200 may be formed of the same material as the source electrode 125 and the drain electrode 126.

The step of forming the first contact hole CH1 may include a step of exposing a portion of the thin film transistor Tr2. For example, the step of forming the first contact hole CH1 may include a step of exposing the drain electrode 126 of the thin film transistor Tr2. The first contact hole CH1 may be formed to overlap with the drain electrode 126.

The step of forming the first penetrating hole 130h may include a step of exposing a portion of the auxiliary electrode 200. The first penetrating hole 130h may be formed to overlap with the auxiliary electrode 200.

Figure 5B:
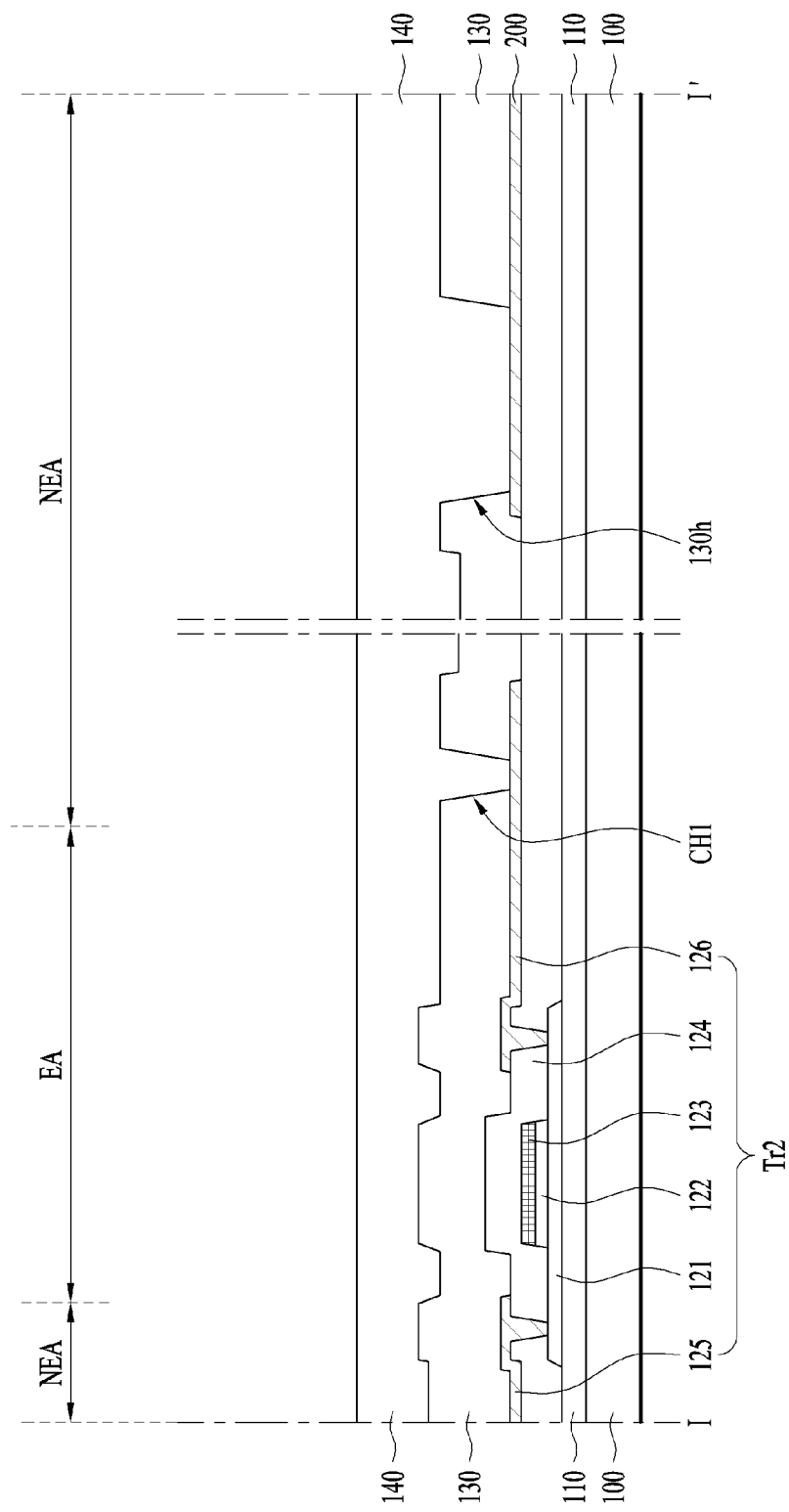

As shown in FIG. 5B, the method of forming the display device according to the embodiment of the present invention may include a step of forming an over-coat layer 140 on the lower passivation layer having the first contact hole CH1 and the first penetrating hole 130h.

The over-coat layer 140 may be extended to the inside of the first contact hole CH1 and the inside of the first penetrating hole 130h of the lower passivation layer 130. The first contact hole CH1 and the first penetrating hole 130h may be filled by the over-coat layer 140.

As shown in FIG. 5C, the method of forming the display device according to the embodiment of the present invention may include a step of partially exposing the over-coat layer 140.

The over-coat layer 140 may be formed of a photosensitive material, such as photoresist. For example, the exposed portion of the over-coat layer 140 may be different from the non-exposed portion of the over-coat layer 140 in physical properties. The portion exposed by the exposure process of the over-coat layer 140 may vary depending on the subsequent process. For example, when the non-exposed portion of the over-coat layer 140 may be removed by the subsequent process, the exposure process of the over-coat layer 140 may use a mask pattern 300 covering regions corresponding a second contact hole CH2 and a second penetrating hole 140h which are formed by the subsequent process. The mask pattern 300 may include a first mask pattern 310 for the second contact hole CH2 formed by the subsequent process and a second mask pattern 320 for the second penetrating hole 140h formed by the subsequent process.

The first mask pattern 310 may be disposed above the first contact hole CH1 of the lower passivation layer 130. The first contact hole CH1 may overlap the first mask pattern 310. The first mask pattern 310 may cover the first contact hole CH1. A planar size of the first mask pattern 310 may be larger than the planar size of the first contact hole CH1.

The second mask pattern 320 may partially cover the first penetrating hole 130h. For example, a side surface of the second mask pattern 320 may be disposed inside the first penetrating hole 130h. An opposite side surface of the second mask pattern 320 may overlap the lower passivation layer 130.

The exposure process of the over-coat layer 140 may be performed to expose the over-coat layer 140 on the lower passivation layer 130. Thus, in the method of forming the display device according to the embodiment of the present invention, the light of the exposure process may be not sufficiently transmitted to some portion K of the over-coat layer 140 which is disposed inside the first penetrating hole 130h and does not overlap with the second mask pattern 320. Therefore, in the method of forming the display device according to the embodiment of the present invention, the over-coat layer 140 may include an un-exposed portion K which fills the first penetrating hole 130h and is disposed under the exposed portion. A side surface of the exposed portion of the over-coat layer 140 above the un-exposed portion K of the over-coat layer 140 may have a reverse taper.

As shown in FIG. 5D, the method of forming the display device according to the embodiment of the present invention may include a step of forming the second contact hole CH2 and the second penetrating hole 140h in the over-coat layer 140.

The step of forming the second contact hole CH2 and the second penetrating hole 140h may include a step of removing a portion of the over-coat layer 140 which is not exposed.

The second contact hole CH2 may be formed above the first contact hole CH1. A planar size of the second contact hole CH2 may be larger than the planar size of the first contact hole CH1. Side surfaces of the second contact hole CH2 may be disposed outside side surfaces of the first contact hole CH1.

The second penetrating hole 140h may be formed on the auxiliary electrode 200. The un-exposed portion K of the over-coat layer 140 disposed inside the first penetrating hole 130h may be removed by the step of removing the portion of the over-coat layer 140 which is not exposed. A side surface of the second penetrating hole 140h may be formed to include a first side region 141sa disposed inside the first penetrating hole 130h and a second side region 142sa overlapping with the lower passivation layer 130. The first side region 141sa may be formed to have a reverse taper. The second side region 142sa may be formed to have positive taper.

Since the un-exposed portion K of the over-coat layer 140 is removed, an under-cut region UC may be formed by the step of forming the second contact hole CH2 and the second penetrating hole 140h under the first side region 141sa of the over-coat layer 140.

Figure 5E:
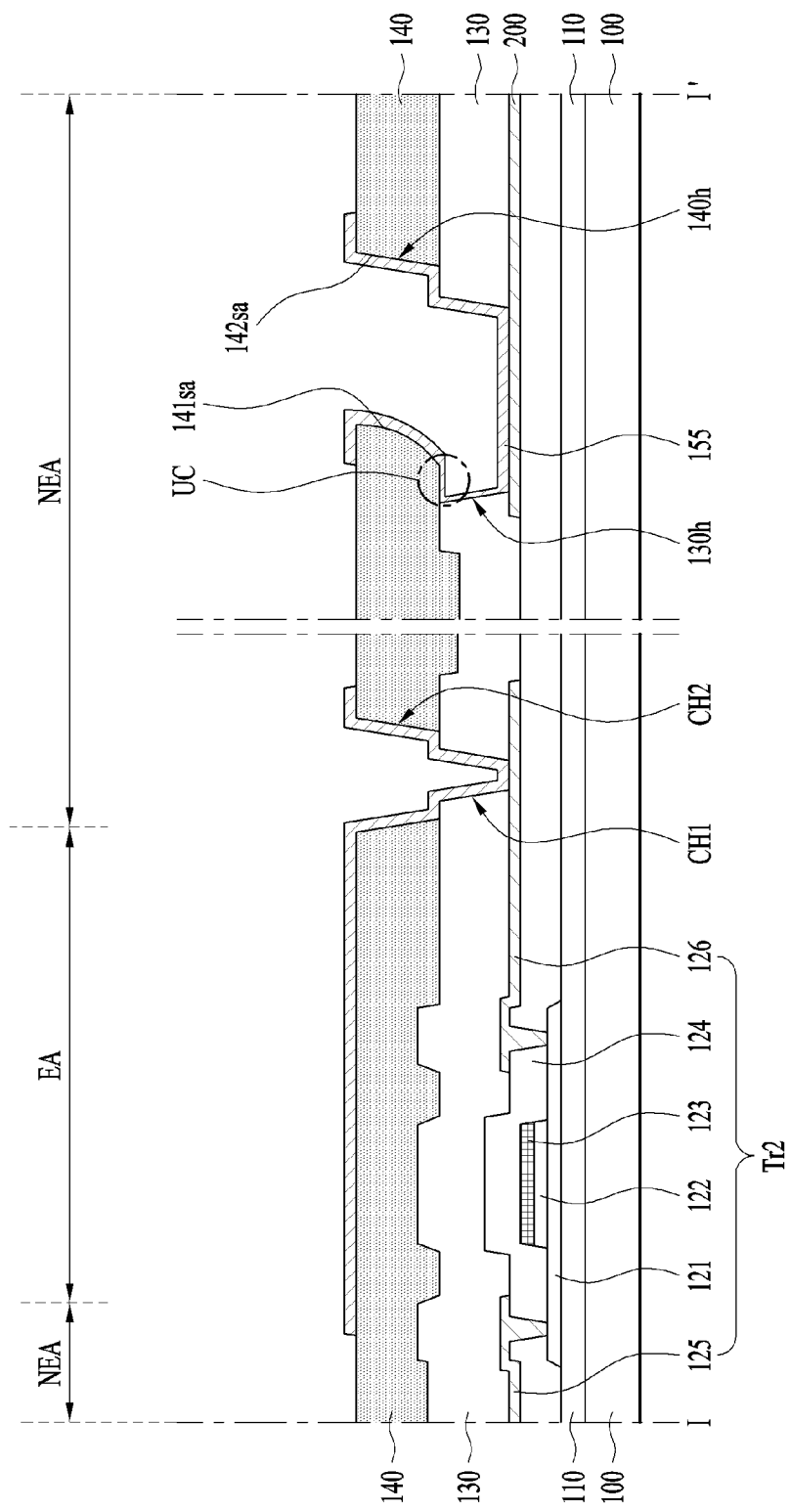

As shown in FIG. 5E, the method of forming the display device according to the embodiment of the present invention may include a step of forming a lower electrode 151 and a connection electrode 155 on the over-coat layer 140 having the second contact hole CH2 and the second penetrating hole 140h.

The connection electrode 155 may be formed of the same material and structure as the lower electrode 151. For example, the connection electrode 155 may be formed simultaneously with the lower electrode 151. The lower electrode 151 and the connection electrode 155 may be formed by a process having higher step coverage, such as sputtering process. The lower electrode 151 may be formed to be extended along a side surface of the first contact hole CH1 and a side surface of the second contact hole CH2. The connection electrode 155 may be formed to be extended along a side surface of the first penetrating hole 130h and a side surface of the second penetrating hole 140h.

The connection electrode 155 may be formed on the first side region 141sa of the second penetrating hole 140h. The connection electrode 155 may be formed to have a relatively thin thickness on the first side region 141sa of the second penetrating hole 140h. The connection electrode 155 formed on the second side region 142sa of the second penetrating hole 140h may be connected to the connection electrode 155 formed on the first side region 141sa of the second penetrating hole 140h.

Figure 5F:
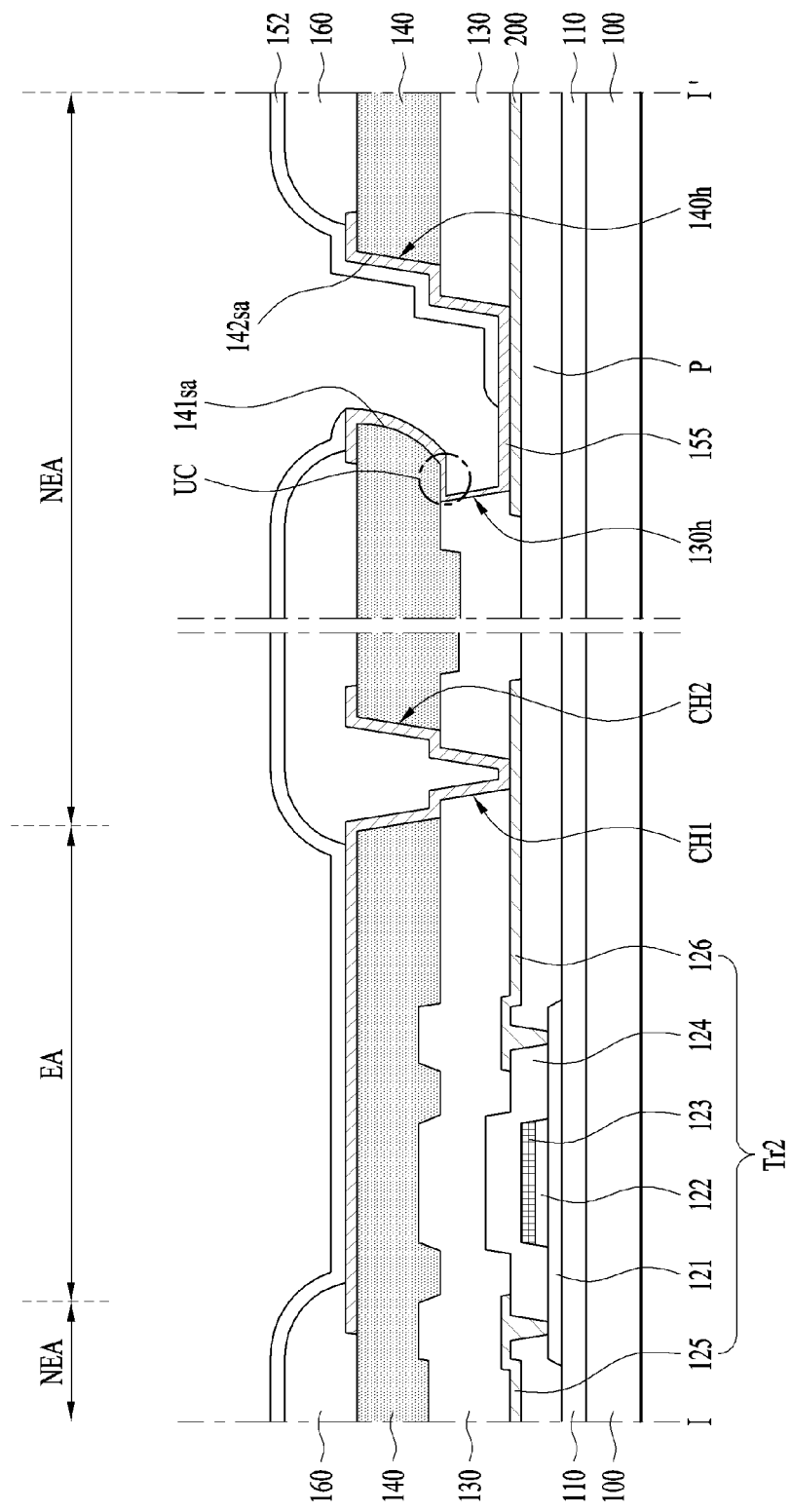

As shown in FIG. 5F, the method of forming the display device according to the embodiment of the present invention may include a step of forming a bank insulating layer 160 covering an edge of the lower electrode 151 and an edge of the connection electrode 155, and a step of forming a light-emitting layer 152 on the lower substrate 100 in which the bank insulating layer 160 is formed.

The light-emitting layer 152 may be formed by a deposition process using evaporation. The auxiliary electrode 200 exposed by the first penetrating hole 130h may be covered by the first side region 141*sa* of the second penetrating hole 140*h* having a reverse tapered in the under-cut region UC. The light-emitting layer 152 may be not formed on a surface of the auxiliary electrode 200 overlapping with an end portion of the over-coat layer 140 including the first side region 141*sa*.

As shown in FIG. 2A, the method of forming the display device according to the embodiment of the present invention may include a step of forming an upper electrode 153 on the lower substrate 100 in which the light-emitting layer 152 is formed.

The upper electrode 153 may be formed by a process having high step coverage, such as sputtering process. The upper electrode 153 may be formed to be extended along the connection electrode 155. The upper electrode 153 may be formed on the first side region 141*sa* of the second penetrating hole 140*h*. The upper electrode 153 may be formed to have a relatively thin thickness on the first side region 141*sa* of the second penetrating hole 140*h*. The upper electrode 153 formed on the second side region 142*sa* of the second penetrating hole 140*h* may be connected to the upper electrode 153 formed on the first side region 141*sa* of the second penetrating hole 140*h*.

Accordingly, in the method of forming the display device according to the embodiment of the present invention, since the second penetrating hole 140*h* of the over-coat layer 140 may be formed to include the second side region 142*sa* which is positively tapered and partially exposes a side surface of the first penetrating hole 130*h* of the lower passivation layer 130 exposing the auxiliary electrode 200, the upper electrode 153 formed by the subsequent process may include a region formed to have a thinner thickness by the under-cut region UC and a region formed to have a normal thickness by the second side region 142*sa* of the second penetrating hole 140*h*, so that the resistance variation of the upper electrode 153 by the under-cut region may be prevented.

In the result, the display device according to the embodiments of the present invention may partially break the under-cut region for preventing the deposition of the light-emitting layer on the auxiliary electrode by adjusting the location of the first penetrating hole of the lower passivation layer and the location of the second penetrating hole of the over-coat layer. Thus, in the display device according to one or more embodiments of the present disclosure, the resistance variation of the upper electrode connected to the auxiliary electrode by the under-cut region may be prevented. Thereby, in the display device according to one or more embodiments of the present disclosure, the reliability of the electric connection between the auxiliary electrode and the upper electrode may be improved.

What is claimed is:

1. A display device comprising:
an auxiliary electrode on a lower substrate in a non-light emitting area;
a lower passivation layer on the auxiliary electrode, the lower passivation layer including a first penetrating hole exposing the auxiliary electrode;
an over-coat layer on the lower passivation layer, the over-coat layer including a second penetrating hole; and
a light-emitting structure in a light emitting area, the light-emitting structure including a lower electrode over the over-coat layer and the lower passivation layer, an upper electrode electrically connected to the auxiliary electrode through the first penetrating hole and the second penetrating hole, and a light-emitting layer between the lower electrode and the upper electrode,
wherein the second penetrating hole includes a side surface intersecting, in a plan view of the display device, a side surface of the first penetrating hole,
wherein the side surface of the second penetrating hole includes a first side region overlapping with the first penetrating hole and a second side region overlapping with the lower passivation layer, and
wherein the first side region has a reverse taper and the second side region has positive taper.

2. The display device according to claim 1, wherein a plane shape of the second penetrating hole in the plan view of the display device is different from a plane shape of the first penetrating hole from the plan view of the display device.

3. The display device according to claim 2, wherein the plane shape of the second penetrating hole is a polygon of a same type as the plane shape of the first penetrating hole.

4. The display device according to claim 2, wherein a length of the second penetrating hole in a first direction is larger than a length of the first penetrating hole in the first direction, and
wherein a length of the second penetrating hole in a second direction is smaller than a length of the first penetrating hole in the second direction, the second direction intersecting the first direction.

5. The device according to claim 4, wherein a planar size of the second penetrating hole is smaller than a planar size of the first penetrating hole.

6. The display device according to claim 1, wherein, in the plan view of the display device, a location of a center of the second penetrating hole is different from a location of a center of the first penetrating hole.

7. The display device according to claim 1, wherein the second penetrating hole intersects side surfaces of the first penetrating hole which are facing each other.

8. A display device comprising:
a thin film transistor on a lower substrate;
an auxiliary electrode on the lower substrate, the auxiliary electrode spaced apart from the thin film transistor;
a lower passivation layer over the thin film transistor, the auxiliary electrode, and the lower substrate, the lower passivation layer including a first contact hole overlapping with the thin film transistor and a first penetrating hole overlapping with the auxiliary electrode;
a light-emitting structure on the lower passivation layer, the light-emitting structure including a lower electrode electrically connected to the thin film transistor through the first contact hole, an upper electrode electrically connected to the auxiliary electrode through the first penetrating hole, and a light-emitting layer between the lower electrode and the upper electrode; and
an over-coat layer between the lower passivation layer and the light-emitting structure, the over-coat layer including a second contact hole overlapping with the first contact hole and a second penetrating hole overlapping the first penetrating hole,
wherein the second penetrating hole includes a first side region that is negatively tapered and a second side region that is positively tapered.

9. The display device according to claim 8, wherein the thin film transistor includes a gate electrode, a source electrode and a drain electrode, and
wherein the auxiliary electrode includes a same material as one of the gate electrode, the source electrode and the drain electrode.

10. The display device according to claim 8, further comprising a connection electrode between the auxiliary electrode and the upper electrode,
   wherein the connection electrode extends onto the over-coat layer.

11. The display device according to claim 10, wherein the connection electrode includes a same material as the lower electrode.

12. The display device according to claim 8, wherein the first side region of the second penetrating hole is overlapping with the first penetrating hole, and
   wherein the second side region of the second penetrating hole is planarly coincident with a side surface of the first penetrating hole.

13. The display device according to claim 12, wherein a plane shape of the first penetrating hole is a square shape, and
   wherein a plane shape of the second penetrating hole is a circular shape inscribed to the first penetrating hole.

14. A display device comprising:
   an auxiliary electrode on a lower substrate;
   a passivation layer on the auxiliary electrode, the passivation layer including a first penetrating hole exposing the auxiliary electrode;
   an over-coat layer on the passivation layer, the over-coat layer including a second penetrating hole overlapping the first penetrating hole, and
   a light-emitting structure including a lower electrode over the over-coat layer and the passivation layer, an upper electrode electrically connected to the auxiliary electrode through the first penetrating hole and the second penetrating hole, and a light-emitting layer between the lower electrode and the upper electrode,
   wherein the second penetrating hole includes a first side region that is negatively tapered and a second side region that is positively tapered.

15. The display device of claim 14, further comprising:
   a light-emitting structure on the passivation layer, the light-emitting structure including a lower electrode, an upper electrode, and a light-emitting layer between the lower electrode and the upper electrode,
   wherein the upper electrode is electrically connected to the auxiliary electrode through the first penetrating hole and second penetrating hole.

16. The display device of claim 15, further comprising:
   a connection electrode having a portion located in the first penetrating hole and on the auxiliary electrode,
   wherein the upper electrode has a portion located in the first penetrating hole and on the connection electrode.

17. The display device of claim 16, wherein a portion of the light-emitting layer partially separates the connection electrode and the upper electrode in the first penetrating hole.

18. The display device of claim 16, wherein at least the portion of the connection electrode in the first penetrating hole and the portion of the upper electrode in the first penetrating hole are in direct contact.

19. The display device of claim 15, wherein a portion of the over-coat layer extends over a portion of first penetrating hole and meets the first side region of the second penetrating hole that is negatively tapered, the portion of the first penetrating hole corresponding to an undercut region,
   wherein a portion of the upper electrode in the undercut region is thinner than a portion of the upper electrode in the second penetrating hole.

* * * * *